(12) United States Patent
Lin

(10) Patent No.: US 12,034,094 B2
(45) Date of Patent: Jul. 9, 2024

(54) DOUBLE-SIDED TUNNELING SILICON-OXIDE PASSIVATED BACK-CONTACT SOLAR CELL AND PREPARATION METHOD THEREOF

(71) Applicant: GOLDEN SOLAR (QUANZHOU) NEW ENERGY TECHNOLOGY CO., LTD., Quanzhou (CN)

(72) Inventor: Kairui Lin, Fujian (CN)

(73) Assignee: Golden Solar (Quanzhou) New Energy Technology Co., Ltd., Quanzhou (CN)

( * ) Notice: Subject to any disclaimer, the term of this patent is extended or adjusted under 35 U.S.C. 154(b) by 0 days.

(21) Appl. No.: 18/516,018

(22) Filed: Nov. 21, 2023

(65) Prior Publication Data

US 2024/0170590 A1 May 23, 2024

(30) Foreign Application Priority Data

Nov. 22, 2022 (CN) .......................... 202211462849.1

(51) Int. Cl.
*H01L 31/0288* (2006.01)
*H01L 31/0216* (2014.01)
(Continued)

(52) U.S. Cl.
CPC .... *H01L 31/0288* (2013.01); *H01L 31/02168* (2013.01); *H01L 31/022441* (2013.01); *H01L 31/202* (2013.01)

(58) Field of Classification Search
None
See application file for complete search history.

(56) References Cited

U.S. PATENT DOCUMENTS

2007/0256728 A1* 11/2007 Cousins ............... H01L 31/068
136/252
2016/0020342 A1 1/2016 Heng et al.
2016/0284922 A1 9/2016 Qui et al.

FOREIGN PATENT DOCUMENTS

CN 111490130 A 8/2020
CN 112164728 A 1/2021
(Continued)

OTHER PUBLICATIONS

The State Intellectual Property Office of People's Republic of China, Notification to Grant Patent Right for Invention (with English translation), Chinese Patent Application No. 202211462849.1, 4 pages, Feb. 1, 2023.

(Continued)

*Primary Examiner* — Eli S Mekhlin
(74) *Attorney, Agent, or Firm* — Thompson Hine LLP

(57) ABSTRACT

Double-sided tunneling silicon-oxide passivated back-contact solar cell and its preparation method including silicon wafer with front surface and back surface. On the back surface of silicon wafer, first semiconductor layer and second semiconductor layer are provided, while on the front surface of silicon wafer, passivation layer is provided. The first semiconductor layer includes first tunneling silicon-oxide layer and first doped polycrystalline silicon layer. The passivation layer includes second tunneling silicon-oxide layer and second doped polycrystalline silicon layer. The thickness of first doped polycrystalline silicon layer is 3-8 times that of second doped polycrystalline silicon layer. The back surface of silicon wafer is provided with first phosphorus-doped diffusion region, and the front surface of silicon wafer, which is textured surface, is provided with second phosphorus-doped diffusion region. The ratio of the depth of first phosphorus-doped diffusion region to the depth (Continued)

of second phosphorus-doped diffusion region ranges from 1-6:1.

12 Claims, 1 Drawing Sheet

(51) Int. Cl.
 *H01L 31/0224* (2006.01)
 *H01L 31/20* (2006.01)

(56) References Cited

FOREIGN PATENT DOCUMENTS

| CN | 112310231 | A | 2/2021 |
|---|---|---|---|
| CN | 112820793 | A | 5/2021 |
| CN | 113644142 | A | 11/2021 |
| CN | 115020513 | A | 9/2022 |
| CN | 115050843 | A | 9/2022 |
| CN | 115207137 | A | 10/2022 |
| CN | 115312633 | A | 11/2022 |
| CN | 115621333 | A | 1/2023 |
| WO | 2021227568 | A1 | 11/2021 |
| WO | 2022100081 | A1 | 5/2022 |
| WO | 2022142343 | A1 | 7/2022 |

OTHER PUBLICATIONS

China State Intellectual Property (ISA/CN), International Search Report (with English translation), International Application No. PCT/CN2023/119679, 10 pages, Nov. 8, 2023.
China State Intellectual Property (ISA/CN), Written Opinion of the International Searching Authority (with English translation), International Application No. PCT/CN2023/119679, 8 pages, Nov. 8, 2023.

* cited by examiner

DOUBLE-SIDED TUNNELING SILICON-OXIDE PASSIVATED BACK-CONTACT SOLAR CELL AND PREPARATION METHOD THEREOF

This application claims priority to Chinese patent application Serial No. 202211462849.1 filed with the Chinese Patent Office on Nov. 22, 2022, and entitled "Double-sided Tunneling Silicon-oxide Passivated Back-contact Solar Cell and Preparation Method thereof," the entire contents of which are incorporated by reference herein.

TECHNICAL FIELD

The present disclosure belongs to the technical field of back-contact solar cells, specifically related to a double-sided tunneling silicon-oxide passivated back-contact solar cell and its preparation method.

BACKGROUND

The current process flow for back-contact heterojunction solar cells is generally as follows: S101, providing a silicon wafer of a single-sided textured and polished structure; S102, successively plating a first semiconductor layer and a first mask layer on the back surface of the silicon wafer, wherein the first semiconductor layer comprises intrinsic amorphous or microcrystalline silicon and N-type doped amorphous or microcrystalline silicon layers; S103, lasering or etching openings on the back surface of the silicon wafer, removing the first mask layer and part of the first semiconductor layer, and forming openings for the second semiconductor region; S104, cleaning the silicon wafer, and removing the first semiconductor layer within the second semiconductor region; S105, forming a second semiconductor layer on the back surface of the silicon wafer, wherein the second semiconductor layer is formed using PECVD or Hot-wire methods; the second semiconductor layer comprises intrinsic amorphous or microcrystalline silicon layer and P-type doped amorphous or microcrystalline silicon layer; S106, sequentially forming a front surface passivation layer and an antireflection layer on the front surface, wherein the front surface passivation layer and antireflection layer are formed using PECVD or Hot-wire methods; the front surface passivation layer comprises intrinsic amorphous silicon layer and N-type doped amorphous or microcrystalline silicon layer, and the antireflection layer is made of at least one of silicon nitride, silicon oxynitride, or silicon oxide; S107, lasering or etching openings on the back surface of the silicon wafer, forming a first semiconductor region arranged alternately with the second semiconductor region; S108, cleaning the silicon wafer, removing the first mask layer within the first semiconductor region; S109, depositing a conductive film on the back surface of the silicon wafer; S110, forming an insulating trench between the first semiconductor region and the second semiconductor region in a manner of laser or etching; and S111, forming metal electrodes on the first semiconductor region and the second semiconductor region of the silicon wafer.

From the above, it is evident that in the current back-contact heterojunction solar cells, the first semiconductor layer on the back surface and the passivation layer on the front surface of the cell are intrinsic amorphous silicon layer and N-type doped amorphous/microcrystalline silicon layer. However, currently, the intrinsic amorphous silicon layer and the N-type doped amorphous/microcrystalline silicon layer are typically plated separately using flat-panel PECVD. Simultaneous deposition on both the front surface and back surface is not feasible. Consequently, to create the first semiconductor layer and the passivation layer on the front surface of the cell, two separate flat-panel PECVD devices are required. However, the flat-panel PECVD device is quite expensive, and the separate plating on the front surface and back surface further increases the equipment costs.

SUMMARY

An aspect of the present disclosure comprises addressing the limitations of conventional back-contact heterojunction solar cells in existing technologies, where the first semiconductor layer on the back surface and the passivation layer on the front surface need to be deposited separately, leading to increased equipment costs. Therefore, the present disclosure provides a double-sided tunneling silicon-oxide passivated back-contact solar cell and its preparation method. The back-contact solar cell allows for simultaneous deposition of the first semiconductor layer and the passivation layer on both the front surface and back surface, which significantly reduces production costs. This cost reduction encompasses a shortened production cycle, lowered material expenses, and reduced equipment costs, thereby simplifying the manufacturing process. Furthermore, the cell structure balances superior passivation capability and enhances the efficiency of cell photovoltaic conversion, thereby improving production yield.

In the first aspect, the present disclosure provides a double-sided tunneling silicon-oxide passivated back-contact solar cell, comprising a silicon wafer with a front surface and a back surface. On the back surface of the silicon wafer, a first semiconductor layer and a second semiconductor layer are provided, while on the front surface of the silicon wafer, a passivation layer is provided. The first semiconductor layer comprises a first tunneling silicon-oxide layer and a first doped polycrystalline silicon layer, sequentially arranged from inside to outside. The passivation layer comprises a second tunneling silicon-oxide layer and a second doped polycrystalline silicon layer, sequentially arranged from inside to outside. A thickness of the first doped polycrystalline silicon layer is 3-8 times that of the second doped polycrystalline silicon layer. The back surface of the silicon wafer is provided with a first phosphorus-doped diffusion region, and the front surface of the silicon wafer, which is a textured surface, is provided with a second phosphorus-doped diffusion region. The ratio of the depth of the first phosphorus-doped diffusion region to the depth of the second phosphorus-doped diffusion region ranges from 1-6:1.

In one or more optional embodiments, the ratio of the surface doping indices of the first doped polycrystalline silicon layer to the second doped polycrystalline silicon layer is within the range of 0.2-5:1. The surface doping index is defined as a ratio of an effective doping concentration of the respective doped polycrystalline silicon layer to the thickness of that doped polycrystalline silicon layer.

In one or more optional embodiments, the effective doping concentration for both the first doped polycrystalline silicon layer and the second doped polycrystalline silicon layers is independently within the range of 1e19-4e20 $cm^{-3}$.

In one or more optional embodiments, the thickness of the first doped polycrystalline silicon layer ranges from 50 to 200 nm, while the thickness of the second doped polycrystalline silicon layer ranges from 15 to 50 nm.

In one or more optional embodiments, the thickness of the first tunneling silicon-oxide layer and the second tunneling silicon-oxide layer is independently within the range of 1 to 3 nm.

In one or more optional embodiments, the second semiconductor layer comprises, arranged sequentially from inside to outside, an amorphous silicon passivation layer and a doped silicon layer.

The doped silicon layer can be either a doped amorphous silicon layer or a doped microcrystalline silicon layer.

The thickness of the amorphous silicon passivation layer can be within the range of 3 to 15 nm, while the thickness of the doped silicon layer is within the range of 4 to 30 nm.

In one or more optional embodiments, the silicon wafer can be either N-type or P-type. Both the first doped polycrystalline silicon layer and the second doped polycrystalline silicon layer are N-type doped, and the doped silicon layer is P-type doped.

In one or more optional embodiments, the back surface of the silicon wafer is provided with a first region of the first semiconductor layer in direct contact with the silicon wafer, a second region of the second semiconductor layer in direct contact with the silicon wafer, and a transition region between the first region and second region. The transition region comprises, arranged sequentially from inside to outside, the first semiconductor layer, the second semiconductor layer, and a mask layer optionally provided between the first semiconductor layer and the second semiconductor layer.

In one or more optional embodiments, a width of the first region ranges from 0.1 to 0.3 mm, a width of the second region ranges from 0.3 to 0.6 mm, and a thickness of the mask layer ranges from 30 to 80 nm.

In one or more optional embodiments, the back-contact solar cell further comprises:
an antireflection layer arranged on the passivation layer;
a conductive film layer arranged on the back surface of the silicon wafer, and located on the surfaces of the first region, second region, and transition region, wherein a portion of the conductive film layer located in the transition region is provided with an insulating trench; and
a metal electrode arranged on the first region and the second region respectively, wherein the metal electrode is located on the surface of the conductive film layer.

The antireflection layer can have a thickness on the textured surface ranging from 60 to 85 nm, and the conductive film layer has a thickness ranging from 30 to 120 nm.

A width of the insulating trench can be between 20 and 120 μm.

In the second aspect, the preparation method for the back-contact solar cell provided in the first aspect of the present disclosure comprises the following steps:
S101, providing a cleaned silicon wafer that has been polished on the back surface and textured on the front surface; and
S102, simultaneously forming the corresponding tunneling silicon-oxide layer and doped polycrystalline silicon layer on both the back surface and front surface of the silicon wafer, wherein
the process of forming the doped polycrystalline silicon layer after creating the tunneling silicon-oxide layer comprises the following sub-steps:
at first, simultaneously depositing undoped intrinsic amorphous silicon layers on surfaces of the corresponding tunneling silicon-oxide layers on the back surface and the front surface;
then, plating a phosphorus-doped film layer by in-situ doping on the back surface, wherein the phosphorus-doped film layer can be either polycrystalline silicon film layer or amorphous silicon film layer;
proceeding with phosphorus diffusion, ensuring that both the front surface and back surface of the silicon wafer remain exposed during the phosphorus diffusion to ensure simultaneous phosphorus diffusion and the simultaneous formation of phosphosilicate glass layers on the front surface and back surface; and
then, removing the phosphosilicate glass layers.

The sum of the thicknesses of the intrinsic amorphous silicon layer and the phosphorus-doped film layer can be controlled to be 3-8 times the thickness of the intrinsic amorphous silicon layer.

In one or more optional embodiments, the deposition of the intrinsic amorphous silicon layer is achieved using the LPCVD method; and the deposition of the phosphorus-doped film layer is achieved using the PECVD method.

The doping concentration of phosphorus in the phosphorus-doped film layer can range from 1e19 to 4e20 $cm^{-3}$.

In one or more optional embodiments, the phosphorus diffusion comprises conditions as follows: firstly, entering a first phase of pre-deposition, wherein in the first phase, at least one of phosphorus oxychloride, nitrogen, or oxygen is introduced, which leads to a chemical reaction that forms elemental phosphorus and a PSG layer; the reaction temperature during the first phase is 750-850° C., and the duration is 5-180 min; and subsequently, entering a second phase of temperature-rising phosphorus diffusion, wherein the second phase takes place in an oxygenated atmosphere. As phosphorus diffusion progresses with increased temperature, a non-doped oxide layer forms between the PSG layer and the intrinsic amorphous silicon layer (intrinsic silicon crystal layer). The temperature for the second phase is 800-900° C., lasting 10-300 min.

In certain embodiments, the preparation method also comprises as follows. In S102, by an approach of laser SE, a part region of the phosphosilicate glass layer formed on the back surface, which is located within the N-type emitter, is laser-doped. This enhances the effective doping concentration and diffusion depth. Then, the phosphosilicate glass layer is removed.

In one or more optional embodiments, the preparation method further comprises:
S103, forming a mask layer on the back surface of the silicon wafer obtained from S102 and forming an antireflection layer on the front surface of the silicon wafer;
S104, performing the first etching opening on the back surface of the silicon wafer obtained from S103, forming second semiconductor opening regions Wp spaced apart from each other; then, cleaning to expose the silicon wafer within the Wp;
S105, depositing the second semiconductor layer on the back surface of the silicon wafer obtained from S104;
S106: performing the second etching opening on the back surface of the silicon wafer obtained from S105, forming first semiconductor opening region Wn, alternately arranged with the second semiconductor opening region Wp; forming transition region Wg, between Wp and Wn; after this, cleaning to expose the doped polycrystalline silicon layer;
S107, depositing a conductive film layer on the back surface of the silicon wafer obtained from S106;
S108, performing the third etching opening on a part of the conductive film layer located in the transition region Wg, of the back surface of the silicon wafer obtained from S107, forming an insulating trench Wi; and S109, forming metal electrodes on the surfaces of the second semiconductor opening region Wp and the first semiconductor opening region Wn of the back surface of the silicon wafer obtained from S108.

The first etching opening can use a laser opening method. The laser is either ultraviolet or green light, and a pulse width of the laser is less than 100 ns.

The second etching opening can use a laser opening method. The laser is either ultraviolet or green light, and a pulse width of the laser is less than 50 ns.

The embodiment of the present disclosure has the following beneficial effects.

By using the specific structure described in the present disclosure, particularly with the double-sided tunnel silicon oxide passivation in combination with first doped polycrystalline silicon layer and second doped polycrystalline silicon layer that have appropriately thicknesses, along with phosphorus-doped diffusion regions arranged correspondingly on both front surface and back surface of the silicon wafer, it ensures excellent passivation capabilities on both front surface and back surface, thereby enhancing the efficiency of the photoelectric conversion of the cell, and improving production yield. The structure allows for the simultaneous deposition of the first semiconductor layer and passivation layer on both the front surface and back surface, significantly reducing production costs and simplifying the manufacturing process. The thickness of the second doped polycrystalline silicon layer on the front surface of the cell is appropriately thin, thus reducing parasitic optical absorption losses. The thickness of the first doped polycrystalline silicon layer on the back surface of the cell is appropriately thick, providing strong lateral conductivity, which is beneficial for electron collection and lateral conduction. It also significantly improves the resistance to laser opening in the manufacturing process. Additionally, the cell is provided with thinner polycrystalline window layers on the front surface and thicker conductive layers on the back surface, which meets the requirements for equipment. Both the front surface and back surface of the cell are provided with corresponding phosphorus-doped diffusion regions featuring appropriate depth. This helps reduce contact resistance on the back contact and increases the photocurrent on the front, thus improving conversion efficiency. Under identical conditions, if the thickness ratio of the corresponding doped polycrystalline silicon layer is too high, or if the depth ratio of the corresponding phosphorus-doped diffusion region is too large, it can lead to an insufficient FSF field on the front surface or an enlarged dead zone on the back surface, resulting in reduced passivation ability. If the thickness ratio of the corresponding doped polycrystalline silicon layer is too low and the depth ratio of the corresponding phosphorus-doped diffusion region is too small, it can cause poor contact resistance between the back-surface emitter and the electrode, leading to a lower fill factor for the cell.

The present disclosure not only reduces equipment investment but also maintains optimized process adjustment windows, which ensures excellent manufacturability, balances the efficiency of photoelectric conversion, and production costs, and maintains production yield at a high level.

BRIEF DESCRIPTION OF DRAWINGS

In order to more clearly illustrate the technical solutions of the embodiments of the present disclosure, the following will briefly introduce the drawings used in the embodiments. It should be understood that the following drawings only show some embodiments of the present disclosure, and therefore it should not be regarded as a limitation on the scope. Those ordinary skilled in the art can also obtain other related drawings based on these drawings without substantial effort.

DETAILED DESCRIPTION

Figure 1:
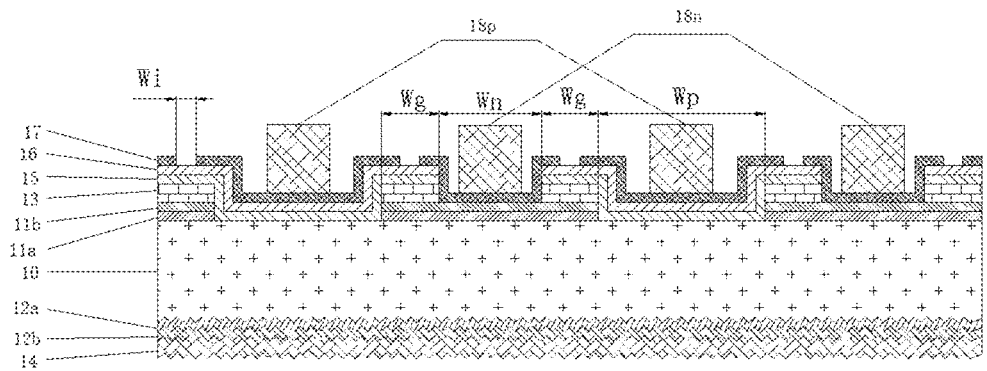
FIG. 1 shows a schematic diagram of the structure of a double-sided tunneling silicon-oxide passivated back-contact solar cell provided in the present disclosure.

In the present disclosure, unless otherwise stated, directional terms such as "above, below, left, right" generally refer to orientation as understood in conjunction with the drawings and the practical application, while "inner, outer" refers to the inner and outer contours of components. Additionally, the terms "first" and "second" are used for descriptive objectives only and should not be understood as indicating or implying relative importance or specifying the quantity of the indicated technical features. Consequently, features labeled with "first" or "second" can explicitly or implicitly comprise one or more of those features. In the description of the present disclosure, the term "multiple" means two or more, unless otherwise explicitly specified.

The endpoints of the range disclosed in the present disclosure and any values are not limited to the precise range or value; these ranges or values should be understood to comprise values close to these ranges or values. For numerical ranges, the values between the endpoints of different ranges, between the endpoints of different ranges and individual points, and between individual points themselves can be combined to form one or more new numerical ranges, where the numerical ranges should be considered as specifically disclosed herein. The terms "alternative" and "optional" both mean that it can be comprised or may not be comprised (or can exist or may not exist).

In the present disclosure, "inner" refers to the direction closer to the silicon wafer, and "outer" refers to the direction away from the silicon wafer.

Unless specified under particular conditions in the embodiments, standard conditions or conditions recommended by the manufacturer are used. Reagents or instruments not specified by a manufacturer are conventional products that can be commercially obtained.

Additionally, it is worth noting that the "and/or" in the present disclosure comprises three cases, namely, A and/or B comprises the existence of A alone, the existence of B alone, and the simultaneous existence of A and B.

In the first aspect, the present disclosure provides a double-sided tunneling silicon-oxide passivated back-contact solar cell, comprising a silicon wafer with a front surface and a back surface. On the back surface of the silicon wafer, a first semiconductor layer and a second semiconductor layer are provided, while on the front surface of the silicon wafer, a passivation layer is provided. The first semiconductor layer comprises a first tunneling silicon-oxide layer and a first doped polycrystalline silicon layer, sequentially arranged from inside to outside. The passivation layer comprises a second tunneling silicon-oxide layer and a second doped polycrystalline silicon layer, sequentially arranged from inside to outside. A thickness of the first doped polycrystalline silicon layer is 3-8 times that of the second doped polycrystalline silicon layer. The back surface of the silicon wafer is provided with a first phosphorus-doped diffusion region, and the front surface of the silicon wafer, which is a textured surface, is provided with a second phosphorus-doped diffusion region. The ratio of the depth of the first phosphorus-doped diffusion region to the depth of the second phosphorus-doped diffusion region ranges from 1-6:1.

The present disclosure utilizes corresponding tunneling silicon-oxide layers and corresponding doped polycrystalline silicon layers as the first semiconductor layer and the front surface passivation layer. The first semiconductor layer and front surface passivation layer can be deposited on both sides simultaneously (for instance, using wet processes or a tube furnace), which significantly reduces equipment costs and simplifies the manufacturing process. However, the first semiconductor layer and front surface passivation layer in conventional back-contact heterojunction solar cells are typically composed of intrinsic amorphous silicon layers and N-type doped amorphous/microcrystalline silicon layers. The layers are usually deposited separately using a flat-panel PECVD system, which requires two sets of flat-panel PECVD devices. Additionally, the costs of the flat-panel PECVD device are generally several times higher than equipment costs of tube furnace.

In the present disclosure, it should be understood that, since the front surface of the silicon wafer is the textured surface, the thickness or depth of various layers on the front surface of the silicon wafer can be converted to the thickness on the textured surface based on planar thickness. This is a common practice in the field and does not need further elaboration here.

The depth ratio between the first phosphorus-doped diffusion region and the second phosphorus-doped diffusion region is in the range of 1-6:1. For example, it can be, but is not limited to, 1:1, 1.4:1, 1.5:1, 1.6:1, 2:1, 3:1, 4:1, 5:1, 6:1, or any value within the range formed between any two of the above ratios. In some embodiments, the depth ratio between the first phosphorus-doped diffusion region and the second phosphorus-doped diffusion region is in the range of 1.5-5:1. In one solution, it is more conducive to improving conversion efficiency while balancing production costs and yield.

The thickness of the first doped polycrystalline silicon layer is 3 to 8 times the thickness of the second doped polycrystalline silicon layer. For example, it can be, but is not limited to, 3, 3.5, 4, 4.5, 5, 5.5, 6, 6.5, 7, 7.5, 8, or any value within the range formed between any two of the above values. A thickness of the first doped polycrystalline silicon layer can be 3 to 5 times the thickness of the second doped polycrystalline silicon layer. In one scenario, it is more conducive to improving conversion efficiency while balancing production costs and yield.

In some embodiments, the ratio of the surface doping index of the first doped polycrystalline silicon layer to the surface doping index of the second doped polycrystalline silicon layer is in the range of 0.2-5:1. For example, it can be, but is not limited to, 0.2:1, 0.5:1, 1:1, 2:1, 3:1, 4:1, 5:1, or any value within the range formed between any two of the above values. The ratio can be in the range of 1:1 to 5:1. The surface doping index represents as a ratio of an effective doping concentration of the respective doped polycrystalline silicon layer to the thickness of that doped polycrystalline silicon layer. In some embodiments of the present disclosure, it is able to enhance the conductivity of the back surface emitter while minimizing infrared absorption on the front surface, thus improving the conversion efficiency of the cell, increasing production yield, and reducing production costs.

The effective doping concentration and thickness of the first doped polycrystalline silicon layer and the second doped polycrystalline silicon layer of the present disclosure are proper as long as they can satisfy the ratio of the aforementioned surface doping indices. For instance, in some embodiments, the effective doping concentrations of the first doped polycrystalline silicon layer and second doped polycrystalline silicon layer are each independently in the range of 1e19-4e20 $cm^{-3}$ (i.e., $1 \times 10^{19}$–$4 \times 10^{20}$ $cm^{-3}$). For example, it can be, but is not limited to, $1 \times 10^{19}$ $cm^{-3}$, $5 \times 10^{19}$ $cm^{-3}$, $1 \times 10^{20}$ $cm^{-3}$, $1.5 \times 10^{20}$ $cm^{-3}$, $2 \times 10^{20}$ $cm^{-3}$, $2.5 \times 10^{20}$ $cm^{-3}$, $3 \times 10^{20}$ $cm^{-3}$, $3.5 \times 10^{20}$ $cm^{-3}$, $4 \times 10^{20}$ $cm^{-3}$, or any value within the range formed between any two of the above values.

In some embodiments, the thickness of the first doped polycrystalline silicon layer is 50-200 nm. It can be, but is not limited to, 50 nm, 100 nm, 150 nm, 200 nm, or any value within the range formed between any two of the above values. The thickness of the second doped polycrystalline silicon layer is 15-50 nm. It can be, but is not limited to, 15 nm, 20 nm, 25 nm, 30 nm, 35 nm, 40 nm, 45 nm, 50 nm, or any value within the range formed between any two of the above values.

In some embodiments, the thickness of the first tunneling silicon-oxide layer and the second tunneling silicon-oxide layer is independently in the range of 1-3 nm. It can be, but is not limited to, 1 nm, 1.5 nm, 2 nm, 2.5 nm, 3 nm, or any value within the range formed between any two of the above values.

The second semiconductor layer of the present disclosure can be of conventional construction, for example in some embodiments, the second semiconductor layer comprises, arranged sequentially from inside to outside, an amorphous silicon passivation layer and a doped silicon layer.

The doped silicon layer can be either a doped amorphous silicon layer or a doped microcrystalline silicon layer.

In some embodiments, the thickness of the amorphous silicon passivation layer is 3-15 nm. It can be, but is not limited to, 3 nm, 5 nm, 7 nm, 9 nm, 10 nm, 11 nm, 13 nm, 15 nm, or any value within the range formed between any two of the above values. The thickness of the doped silicon layer is 4-30 nm. It can be, but is not limited to, 4 nm, 8 nm, 10 nm, 12 nm, 15 nm, 20 nm, 25 nm, 30 nm, or any value within the range formed between any two of the above values.

In some embodiments, the silicon wafer can be either N-type or P-type. The first doped polycrystalline silicon layer and the second doped polycrystalline silicon layer are both N-type doped, and the doped silicon layer is P-type doped.

In the present disclosure, the silicon wafer can be a czochralski single-crystal silicon wafer or a cast single-crystal silicon wafer.

The first semiconductor layer and the second semiconductor layer in the back-contact solar cell of the present disclosure can be arranged according to existing structures. For example, in some embodiments, the back surface of the silicon wafer is provided with a first region of the first semiconductor layer in direct contact with the silicon wafer, a second region of the second semiconductor layer in direct contact with the silicon wafer, and a transition region between the first region and second region. The transition region comprises, arranged sequentially from inside to outside, the first semiconductor layer, the second semiconductor layer, and a mask layer optionally provided between the first semiconductor layer and the second semiconductor layer. It can be understood that when there is no mask layer arranged between the first semiconductor layer and the second semiconductor layer, the first semiconductor layer and the second semiconductor layer are in direct contact.

In some embodiments, the width of the first region is 0.1-0.3 nm. It can be, but is not limited to, 0.1 mm, 0.15 mm, 0.2 mm, 0.25 mm, 0.3 mm, or any value within the range formed between any two of the above values. The width of the second region is 0.3-0.6 nm. It can be, but is not limited to, 0.3 mm, 0.35 mm, 0.4 mm, 0.45 mm, 0.5 mm, 0.55 mm, 0.6 mm, or any value within the range formed between any two of the above values.

The thickness of the mask layer is 30-80 nm. It can be, but is not limited to, 30 nm, 40 nm, 50 nm, 60 nm, 70 nm, 80 nm, or any value within the range formed between any two of the above values.

The back-contact solar cell in the present disclosure can also comprise other necessary existing film layers. For example, in some embodiments, the back-contact solar cell further comprises:
- an antireflection layer arranged on the passivation layer;
- a conductive film layer arranged on the back surface of the silicon wafer, and located on the surfaces of the first region, second region, and transition region, wherein a portion of the conductive film layer located in the transition region is provided with an insulating trench; and
- a metal electrode arranged on the first region and the second region respectively, wherein the metal electrode is located on the surface of the conductive film layer.

The antireflection layer can have a thickness on the textured surface ranging from 60 to 85 nm, and the conductive film layer can have a thickness ranging from 30 to 120 nm.

In the present disclosure the mask layer and antireflection layer can each be independently selected from at least one of silicon nitride, silicon oxynitride, or silicon oxide.

The material of the conductive film layer can be indium oxide thin film doped with tin oxide, titanium oxide, zinc oxide, or gallium oxide, or zinc oxide thin film doped with aluminum oxide, gallium oxide, or boron oxide.

A width of the insulating trench is between 20 and 120 μm.

In the second aspect, the preparation method for the back-contact solar cell provided in the first aspect of the present disclosure comprises the following steps:
S101, providing a cleaned silicon wafer that has been polished on the back surface and textured on the front surface; and
S102, simultaneously forming the corresponding tunneling silicon-oxide layer and doped polycrystalline silicon layer on both the back surface and front surface of the silicon wafer. It can be understood that, in S102, the second tunneling silicon-oxide layer and the second doped polycrystalline silicon layer are formed on the front surface of the silicon wafer, and simultaneously, the first tunneling silicon-oxide layer and the first doped polycrystalline silicon layer are formed on the back surface of the silicon wafer.

The formation of the tunneling silicon-oxide layer can be carried out using wet or dry methods. The wet methods comprise ozone oxidation, nitric acid oxidation, ozone-water oxidation, etc., while the dry methods comprise thermal oxidation and PECVD in-situ oxidation, among others.

In the present disclosure, the process of forming the doped polycrystalline silicon layer after creating the tunneling silicon-oxide layer comprises the following sub-steps:
at first, simultaneously depositing undoped intrinsic amorphous silicon layers on surfaces of the corresponding tunneling silicon-oxide layers on the back surface and the front surface;
then, plating a phosphorus-doped film layer by in-situ doping on the back surface, wherein the phosphorus-doped film layer can be either polycrystalline silicon film layer or amorphous silicon film layer;
proceeding with phosphorus diffusion, ensuring that both the front surface and back surface of the silicon wafer remain exposed during the phosphorus diffusion to ensure simultaneous phosphorus diffusion and the simultaneous formation of phosphosilicate glass layers on the front surface and back surface; and then, removing the phosphosilicate glass layers.

It can be understood that during the phosphorus diffusion process, the diffusion depth extends into both the front surface and back surface of the silicon wafer, thus creating the previously mentioned first phosphorus-doped diffusion region on the back surface and the second phosphorus-doped diffusion region on the front surface.

The present disclosure controls the thickness of the intrinsic amorphous silicon layer and the phosphorus-doped film layer to regulate the thickness of the first doped polycrystalline silicon layer, the second doped polycrystalline silicon layer, and their ratio. The sum of the thickness of the intrinsic amorphous silicon layer and the phosphorus-doped film layer can be controlled to be 3-8 times the thickness of the intrinsic amorphous silicon layer.

In the process of forming the doped polycrystalline silicon layer as described in the present disclosure, the intrinsic amorphous silicon layer on the front surface, after phosphorus diffusion, forms the doped polycrystalline silicon layer on the front surface. The intrinsic amorphous silicon layer on the back surface, after the deposition of the phosphorus-doped film layer and phosphorus diffusion, combines with the phosphorus-doped film layer to form a doped polycrystalline silicon layer on the back surface after phosphorus diffusion of the intrinsic amorphous silicon layer. The formed phosphosilicate glass layer is removed subsequently.

In the present disclosure, the doping content of the second doped polycrystalline silicon layer on the front surface and the depth of the second phosphorus-doped diffusion region on the front surface are controlled and adjusted through the phosphorus diffusion step, such as by regulating the temperature of the phosphorus diffusion process. The doping content of the first doped polycrystalline silicon layer on the back surface and the depth of the first phosphorus-doped diffusion region on the back surface are controlled through the combined coordination of the phosphorus diffusion step and the deposition of the phosphorus-doped film layer, for example, by adjusting the temperature of the phosphorus diffusion process and adjusting the phosphorus doping concentration of the phosphorus-doped film layer.

In more embodiments, the preparation method also comprises as follows. In S102, by an approach of laser SE, the part region of the phosphosilicate glass layer formed on the back surface, which is located within the N-type emitter, is laser-doped. This enhances the effective doping concentration and diffusion depth. Then, the phosphosilicate glass layer is removed. In one solution, it is possible to independently control the depth of phosphorus diffusion on the front surface and back surface. When combined with the use of laser SE processes on the back surface, it becomes more feasible to ensure a higher peak effective doping concentration on the outer surface of the first doped polycrystalline silicon layer. This coordination allows for fine-tuned control over the doping content of the first phosphorus-doped diffusion region on the back surface and the depth of the first phosphorus-doped diffusion region on the back surface while establishing stable and effective ohmic contact, ensuring a better contact resistance on the back surface.

In some embodiments, the intrinsic amorphous silicon layer is deposited using LPCVD, and the phosphorus-doped film layer is plated using PECVD.

The doping concentration of phosphorus in the phosphorus-doped film layer can range from 1e19 to 4e20 $cm^{-3}$.

Maintaining both the front surface and back surface of the silicon wafer in an exposed state means that the silicon wafer is not placed conventionally in a stacked or back-to-back arrangement. Instead, the front surface and back surface of the silicon wafer are both exposed to the ambient atmosphere, thus ensuring that the front surface and back surface simultaneously undergo the phosphorus diffusion process and form the phosphosilicate glass layer. The method of maintaining both the front surface and back surface of the silicon wafers in an exposed state can be, for example, by placing the silicon wafer at intervals.

In some embodiments, the phosphorus diffusion comprises conditions as follows. Firstly, a first phase of pre-deposition is carried out, in the first phase, at least one of phosphorus oxychloride, nitrogen, or oxygen is introduced, which leads to a chemical reaction that forms elemental phosphorus and a PSG layer; the reaction temperature during the first phase is 750-850° C., and the duration is 5-180 min. Subsequently, the process moves to a second phase of temperature-rising phosphorus diffusion, wherein the second phase takes place in an oxygenated atmosphere. As phosphorus diffusion progresses with increased temperature, a non-doped oxide layer forms between the PSG layer and the intrinsic amorphous silicon layer. The temperature for the second phase is 800-900° C., lasting 10-300 min. The phosphorus diffusion can be carried out in a high-temperature phosphorus diffusion furnace.

In some embodiments, the preparation method also comprises: S103, forming a mask layer on the back surface of the silicon wafer obtained from S102 and forming an antireflection layer on the front surface of the silicon wafer.

In S103, the formation of the mask layer can be achieved, for example, using techniques such as plasma-enhanced chemical vapor deposition (PECVD) or low-pressure chemical vapor deposition (LPCVD).

In the first embodiment, the preparation method also comprises:

S104, performing the first etching opening on the back surface of the silicon wafer obtained from S103, forming second semiconductor opening regions Wp spaced apart from each other; then, cleaning to expose the silicon wafer within the Wp, wherein the cleaning process here is used to thoroughly clean the tunneling silicon-oxide layer, the doped polycrystalline silicon layer, and the mask layer within the second semiconductor opening region Wp;

S105, depositing the second semiconductor layer on the back surface of the silicon wafer obtained from S104;

S106: performing the second etching opening on the back surface of the silicon wafer obtained from S105, forming first semiconductor opening region Wn, alternately arranged with the second semiconductor opening region Wp; forming transition region Wg, between Wp and Wn; after this, cleaning to expose the doped polycrystalline silicon layer, wherein the cleaning process here is used to thoroughly clean the mask layer and the second semiconductor layer within the first semiconductor opening region Wn;

S107, depositing a conductive film layer on the back surface of the silicon wafer obtained from S106;

S108, performing the third etching opening on a part of the conductive film layer located in the transition region Wg, of the back surface of the silicon wafer obtained from S107, forming insulating trench Wi; and S109, forming metal electrodes on the surfaces of the second semiconductor opening region Wp and the first semiconductor opening region Wn of the back surface of the silicon wafer obtained from S108. Under one solution, a mask layer is formed between the first semiconductor layer and the second semiconductor layer in the transition region.

In the second solution, there is direct contact between the first semiconductor layer and the second semiconductor layer in the transition region, wherein the difference in the preparation method, as compared to the first embodiment, is that in step S104, during the cleaning process, the mask layer is removed. The removal of the mask layer can be achieved, for example, by using an acidic solution containing fluorine ions.

In the present disclosure, the first etching opening, the second etching opening, and the third etching opening can each be independently conducted using either laser or mask corrosion methods.

The first etching opening can use a laser opening method. The laser is either ultraviolet or green light, and a pulse width of the laser is less than 100 ns.

The second etching opening can use a laser opening method. The laser is either ultraviolet or green light, and a pulse width of the laser is less than 50 ns.

S104 can also comprise smoothing the exposed surface of the silicon wafer in the second semiconductor opening region Wp by using an alkali solution for corrosion, while also performing the corresponding silicon wafer cleaning, so as to prepare for the next step of forming the second semiconductor layer.

In S105, the deposition of the second semiconductor layer can be conducted using PECVD technology.

In S107, the deposition of the conductive film layer can be achieved using physical vapor deposition technology (PVD) or reactive plasma deposition technology (RPD).

After the third etching opening in S108, the resistance between the first semiconductor and the second semiconductor formed respectively in the first semiconductor opening region and the second semiconductor opening region is greater than 10 KΩ.

In S109, forming metal electrodes can be carried out using techniques such as screen printing or electroplating. It can be understood that the metal electrodes comprise the first metal electrode and the second metal electrode. The first metal electrode and the second metal electrode respectively correspond to the first semiconductor opening region and the second semiconductor opening region.

The present disclosure will be further elaborated with specific embodiments below.

EXAMPLE 1

As shown in FIG. 1, a double-sided tunneling silicon-oxide passivated back-contact solar cell comprises a silicon wafer 10 with a front surface and a back surface. On the back surface of the silicon wafer 10, a first semiconductor layer and a second semiconductor layer were provided, while on the front surface of the silicon wafer 10, a passivation layer was provided. The first semiconductor layer comprised a first tunneling silicon-oxide layer 11a and a first doped polycrystalline silicon layer 11b, sequentially arranged from inside to outside. The passivation layer comprised a second tunneling silicon-oxide layer 12a and a second doped polycrystalline silicon layer 12b, sequentially arranged from inside to outside. A thickness of the first doped polycrystalline silicon layer 11b was 5 times that of the second doped polycrystalline silicon layer 12b. The back surface of the silicon wafer 10 was provided with a first phosphorus-doped diffusion region, and the front surface of the silicon wafer 10, which was a textured surface, was provided with a second phosphorus-doped diffusion region. The ratio of the depth of the first phosphorus-doped diffusion region to the depth of the second phosphorus-doped diffusion region was 1.6:1. The ratio of the surface doping indices of the first doped polycrystalline silicon layer 11b to the second doped polycrystalline silicon layer 12b was 1:1. The surface doping index is defined as a ratio of an effective doping concentration of the respective doped polycrystalline silicon layer to the thickness of that doped polycrystalline silicon layer. The effective doping concentration of the second doped polycrystalline silicon layer 12b was 1e19 $cm^{-3}$, and its thickness was 20 nm. The thickness of both the first tunneling silicon-oxide layer 11a and the second tunneling silicon-oxide layer 12a was 2 nm.

Figure 2:
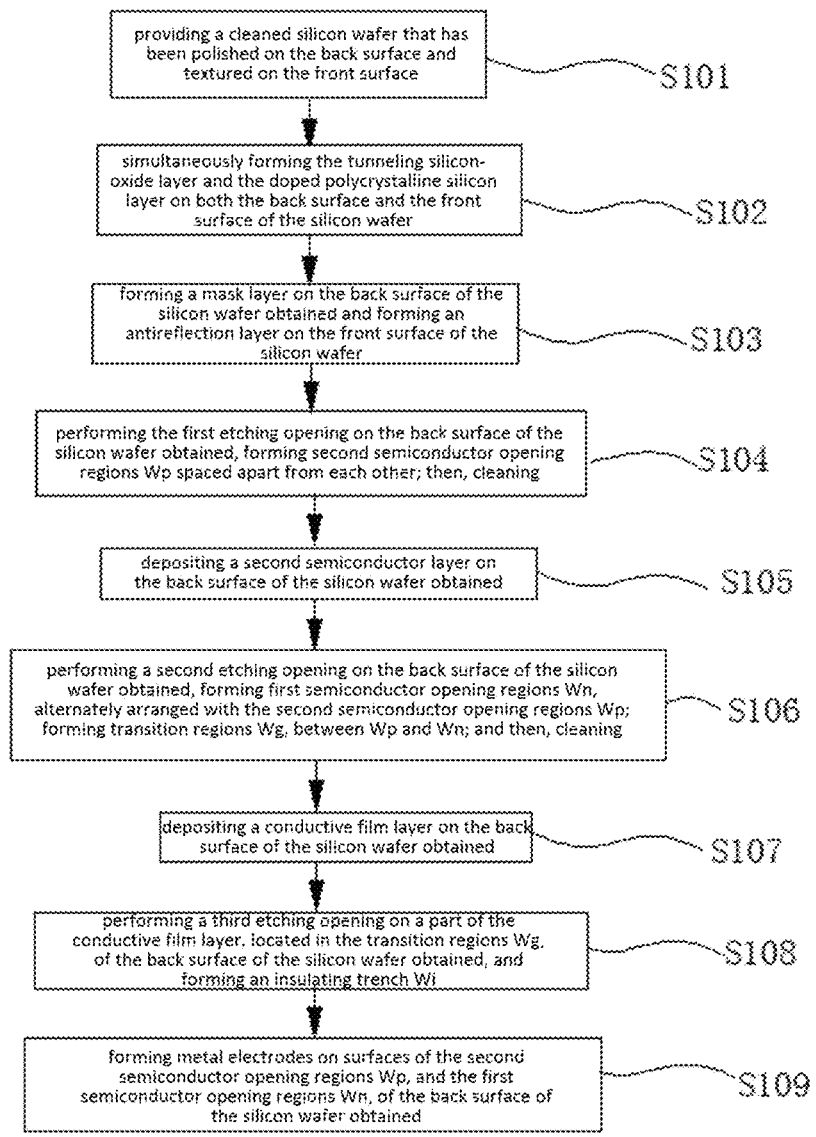
FIG. 2 is a flowchart of a preparation method according to one embodiment provided in the present disclosure.

As shown in FIG. 2, the manufacturing method was as follows.

S101: providing a silicon wafer 10 that has been polished at the back surface and texture cleaned at the front surface. The silicon wafer 10 was an N-type czochralski single-crystal silicon wafer.

S102: simultaneously forming the tunneling silicon-oxide layer and the N-type doped polycrystalline silicon layer on both the front surface and the back surface of the silicon wafer 10. The tunneling silicon-oxide layer was formed using a wet method, wherein the wet method was the ozone oxidation method. The process of forming the N-type doped polycrystalline silicon layer after forming the tunneling silicon-oxide layers on both surfaces comprises: depositing, initially, an undoped intrinsic amorphous silicon layer, which was an intrinsically amorphous/polycrystalline silicon hybrid state, on the surfaces of the tunneling silicon-oxide layer on both the front surface and the back surface of the silicon wafer by LPCVD, wherein the thickness of the intrinsic amorphous silicon layer was 30 nm; then, using the PECVD method to in-situ deposit phosphorus-doped polysilicon on the back surface of the silicon wafer 10. The doping concentration of phosphorus was 1e19 $cm^{-3}$, and the thickness of the phosphorus-doped polysilicon was 120 nm. After the coating process described above, the silicon wafer 10 was placed into a high-temperature phosphorus diffusion furnace for phosphorus diffusion. The conditions for phosphorus diffusion comprise the following stages. Firstly, entering a pre-deposition phase, in the first phase, the phosphorus oxychloride, nitrogen, and oxygen were introduced, which leads to a chemical reaction that forms elemental phosphorus and a PSG layer. The reaction temperature during this phase was 770° C., and the duration was 10 min. Subsequently, the process moved to a second phase of temperature-rising phosphorus diffusion, wherein the second phase took place in an oxygenated atmosphere. As phosphorus diffusion progresses with increased temperature, a non-doped oxide layer forms between the PSG layer and the intrinsic amorphous silicon layer. The temperature for the second phase was 830° C., lasting 20 min. In the phosphorus diffusion step, it is essential to place the silicon wafer 10 with equal spacing rather than the conventional stacked arrangement. This ensures that PSG glass layers (phosphosilicate glass layers) are formed on both sides equally during the phosphorus diffusion process. After this step, the PSG glass layers generated during the previous steps are removed.

S103: on the back surface of the obtained silicon wafer 10, using a plasma-enhanced chemical vapor deposition (PECVD) technique to form a mask layer 13 on the back surface of the silicon wafer 10. Simultaneously, an antireflection layer 14 was formed on the front surface of the wafer 10. Both the mask layer 13 and the antireflection layer 14 were made of silicon nitride, wherein a thickness of the mask layer 13 was 30 nm and a thickness of the antireflection layer 14 was 60 nm on the textured surface.

S104: using a laser to create the first etching opening on the back surface of the silicon wafer 10, forming the second semiconductor opening region Wp. Subsequently, a cleaning process was performed to expose the silicon wafer 10 within the Wp. The width of the second semiconductor opening region Wp was 0.3 mm, and after etching and cleaning, both the first semiconductor layer and the mask layer 13 within the Wp were thoroughly cleaned. The laser used for creating the opening is a UV laser with a pulse width of 10 ns. Smoothing the exposed surface of the silicon wafer 10 in the second semiconductor opening region was made by using an alkali solution for etching, while also the corresponding silicon wafer 10 was cleaned, thus preparing for the next step of the coating of the second semiconductor layer.

S105: depositing a second semiconductor layer on the back surface of the silicon wafer 10 using PECVD technology. The second semiconductor layer comprises an amorphous silicon passivation layer 15 and a doped silicon layer 16 (P-type doped amorphous silicon layer), wherein the thickness of the amorphous silicon passivation layer 15 was 6 nm, and the thickness of the doped silicon layer 16 was 6 nm.

S106: performing the second etching opening on the back surface of the silicon wafer 10 by using a laser etching process, forming the first semiconductor opening region Wn, alternately arranged with the second semiconductor opening region Wp; forming transition region Wg, between Wp and Wn; after this, cleaning to expose first semiconductor layer. The width of the first semiconductor opening region Wn was 0.2 mm, and after etching and cleaning, both the mask layer 13 and the second semiconductor layer were removed in the first semiconductor opening region Wn. The laser used for creating the opening was a UV laser with a pulse width of 5 ns.

S107: depositing a transparent conductive film layer 17 on the back surface of the silicon wafer 10 by using physical vapor deposition (PVD) technology. The thickness of the conductive film layer 17 was 50 nm. The material of the conductive film layer 17 was indium oxide thin film doped with gallium oxide.

S108, performing, by using laser, the third etching opening on a part of conductive film layer 17 located in the transition region Wg, of the back surface of the silicon wafer 10, forming an insulating trench Wi, between the first semiconductor and the second semiconductor. The width of Wi was 50 μm. After etching, the resistance between the first and second semiconductors was greater than 10 KΩ.

S109: forming, on the back surface of the silicon wafer 10, the first metal electrode 18n on the surface of the first semiconductor opening region Wn by a screen-printing technique, and forming the second metal electrode 18p on the surface of the second semiconductor opening region Wp.

EXAMPLE 2

Following the method of Example 1, the difference was altering the thickness of the first doped polycrystalline silicon layer, which was adjusted so that the thickness of the first doped polycrystalline silicon layer was 8 times that of the second doped polycrystalline silicon layer. The corresponding adjustment process was as follows: in S102, the thickness of the phosphorus-doped polysilicon was adjusted to 210 nm.

EXAMPLE 3

Following the method of Example 1, the difference was altering the thickness of the second doped polycrystalline silicon layer, which was adjusted so that the thickness of the first doped polycrystalline silicon layer was 3.4 times that of the second doped polycrystalline silicon layer. The corresponding adjustment process was as follows: in S102, the thickness of the intrinsic amorphous silicon layer was adjusted to 50 nm.

EXAMPLE 4

Following the method of Example 1, the difference was altering the depth of the first phosphorus-doped diffusion region, which was adjusted so that the ratio of the depth of the first phosphorus-doped diffusion region to the second phosphorus-doped diffusion region was 6:1. The corresponding adjustment process was as follows: in S102, the effective doping concentration of the phosphorus-doped polycrystalline layer was adjusted to 3e20 $cm^{-3}$.

EXAMPLE 5

Following the method of Example 1, the difference was altering the depth of the first phosphorus-doped diffusion region, which was adjusted so that the ratio of the depth of the first phosphorus-doped diffusion region to the second phosphorus-doped diffusion region was 1:1. The corresponding adjustment process was as follows: in S102, the effective doping concentration of the phosphorus-doped polycrystalline layer was adjusted to 1e19 $cm^{-3}$.

EXAMPLE 6

Following the method of Example 1, the difference was altering the effective doping concentration of the first doped polycrystalline silicon layer, so that the ratio of the surface doping index of the first doped polycrystalline silicon layer to the surface doping index of the second doped polycrystalline silicon layer was 0.2:1. The corresponding adjustment process was as follows: in S102, the effective doping concentration of the phosphorus-doped polycrystalline layer was adjusted to meet the aforementioned ratio of surface doping index.

COMPARATIVE EXAMPLE 1

Following the method of Example 1, the difference was altering the thickness of the first doped polycrystalline silicon layer, which was adjusted so that the thickness of the first doped polycrystalline silicon layer was 10 times that of the second doped polycrystalline silicon layer. The corresponding adjustment process was as follows: in S102, the thickness of the phosphorus-doped polysilicon was adjusted to 270 nm.

COMPARATIVE EXAMPLE 2

Following the method of Example 1, the difference was altering the thickness of the second doped polycrystalline silicon layer, which was adjusted so that the thickness of the first doped polycrystalline silicon layer was 1.8 times that of the second doped polycrystalline silicon layer. The corresponding adjustment process was as follows: in S102, the thickness of the intrinsic amorphous silicon layer was adjusted to 150 nm.

COMPARATIVE EXAMPLE 3

Following the method of Example 1, the difference was altering the depth of the first phosphorus-doped diffusion region, which was adjusted so that the ratio of the depth of the first phosphorus-doped diffusion region to the second phosphorus-doped diffusion region was 10:1. The corresponding adjustment process was as follows: in S102, the effective doping concentration of the phosphorus-doped polycrystalline layer was adjusted to 3e20 cm-3. The thickness of the intrinsic amorphous silicon layer and the phosphorus-doped polycrystalline silicon was reduced to 20 nm and 80 nm, respectively, while the phosphorus diffusion temperature was lowered from 830° C. to 815° C.

COMPARATIVE EXAMPLE 4

Following the method of Example 1, the difference was that the tunneling silicon-oxide layer in the passivation layer on the front surface of the silicon wafer was replaced with the intrinsic amorphous silicon layer, with no change in thickness. Correspondingly, in S102, a back-to-back configuration was used. However, a polycrystalline layer was formed only on the back surface, and after S102, the rolling coating on the front surface was necessary to be removed through silicon wafer etching. This process required a second high-cost cleaning to prepare for the plating of amorphous silicon on the front surface.

COMPARATIVE EXAMPLE 5

In accordance with the method of Example 1, the difference was that the tunneling silicon-oxide layer in the passivation layer on the front surface of the silicon wafer and the tunneling silicon-oxide layer in the first semiconductor layer on the back surface of the silicon wafer were both replaced with the intrinsic amorphous silicon layers, with no change in thickness. The corresponding adjustment in the process was to eliminate the LPCVD or PECVD preparation of doped polycrystalline silicon films in S102, and prepare a low-temperature amorphous silicon coating film on the back surface (comprising the intrinsic amorphous silicon layer and the N-type doped amorphous or microcrystalline film layer) without going through high-temperature steps. This was followed by laser or etching to create openings. Under the protection of the mask layer, a texturing step and a secondary cleaning step were performed to prepare for the subsequent front surface PECVD plating.

Test Example

The conversion efficiency of the cell produced in the above-described embodiments and the comparative examples was tested. Material costs, and production yield for this batch were measured, and the process cycle was recorded. The results are as shown in Table 1.

TABLE 1

| example number | process cycle (H) | material cost (yuan/sheet) | conversion efficiency of the cell (%) | production yield (%) |
|---|---|---|---|---|
| Example 1 | 10-15 | 1.2 | 25.1% | 99% |
| Example 2 | 13-18 | 1.25 | 25.0% | 99% |
| Example 3 | 12-16 | 1.21 | 24.7% | 99% |
| Example 4 | 12-17 | 1.23 | 24.95% | 99% |
| Example 5 | 9-13 | 1.18 | 25.0% | 97% |
| Example 6 | 10-14 | 1.19 | 25.0% | 98% |
| Comparative Example 1 | 15-19 | 1.31 | 24.9% | 97% |
| Comparative Example 2 | 10-15 | 1.2 | 24.2% | 97% |
| Comparative Example 3 | 9-13 | 1.18 | 24.7% | 96% |
| Comparative Example 4 | 12-16 | 1.35 | 25.8% | 99% |
| Comparative Example 5 | 9-13 | 1.5 | 25.9% | 95% |

Based on the above Examples, Comparative Examples, and Table 1, it is evident that the cells obtained in the embodiments of the present disclosure have lower manufacturing costs and higher production yields compared to traditional HBC cells, combined passivation cells (Comparative Example 4), and cells in Comparative Examples 1 and 3. The cells also maintain a relatively high cell conversion efficiency, making them highly suitable for large-scale adoption of back-contact cells.

Furthermore, according to Examples 1, and Examples 2 to 6, it can be seen that the solution of Example 1 with the disclosed layer structure and optimized phosphorus doping-diffusion condition in the present disclosure provides a better balance between production cost and power generation efficiency, along with improved production yield. This is advantageous for the large-scale production of back-contact cells.

Certain embodiments of the present disclosure are described in detail above; however, the present disclosure is not limited thereto. Within the scope of the technical concept of the present disclosure, various simple modifications can be made to the technical solutions of the present disclosure, including combining any technical features in any other suitable manner. These simple modifications and combinations should also be considered as part of the content disclosed in the present disclosure and fall within the scope of protection of the present disclosure.

Embodiments of the present disclosure provide methods of preparing double-sided tunneling silicon-oxide passivated back-contact solar cells. By using the double-sided tunnel silicon oxide passivation in combination with first doped polycrystalline silicon layer and second doped polycrystalline silicon layer that have appropriately thicknesses, along with phosphorus-doped diffusion regions arranged correspondingly on both front surface and back surface of the silicon wafer, it ensures excellent passivation capabilities on both front surface and back surface, enhancing the efficiency of the photoelectric conversion of the cell, and improving production yield. The structure allows for the simultaneous deposition of the first semiconductor layer and passivation layer on both the front surface and back surface, significantly reducing production costs and simplifying the manufacturing process. The thickness of the second doped polycrystalline silicon layer on the front surface of the cell is appropriately thin, thus reducing parasitic optical absorption losses. The thickness of the first doped polycrystalline silicon layer on the back surface of the cell is appropriately thick, providing strong lateral conductivity, which is beneficial for electron collection and lateral conduction. It also significantly improves the resistance to laser opening in the manufacturing process. Additionally, the cell is provided with thinner polycrystalline window layers on the front surface and thicker conductive layers on the back surface, which meets the requirements for equipment. Both the front surface and back surface of the cell are provided with corresponding phosphorus-doped diffusion regions featuring appropriate depth. This helps reduce contact resistance on the back contact and increases the photocurrent on the front, thus improving conversion efficiency. Under identical conditions, if the thickness ratio of the corresponding doped polycrystalline silicon layer is too high, or if the depth ratio of the corresponding phosphorus-doped diffusion region is too large, it can lead to an insufficient FSF field on the front surface or an enlarged dead zone on the back surface, resulting in reduced passivation ability. If the thickness ratio of the corresponding doped polycrystalline silicon layer is too low and the depth ratio of the corresponding phosphorus-doped diffusion region is too small, it can cause poor contact resistance between the back surface emitter and the electrode, leading to a lower fill factor for the cell. Further, the present disclosure not only reduces equipment investment but also maintains optimized process adjustment windows, which ensures excellent manufacturability, balances the efficiency of photoelectric conversion, and production costs, and maintains production yield at a high level.

Furthermore, it can be understood that the double-sided tunneling silicon-oxide passivated back-contact solar cell and its manufacturing method as provided in the embodiments of the present disclosure are reproducible and can be used in various industrial applications. For example, the double-sided tunneling silicon-oxide passivated back-contact solar cell and its preparation method provided in the embodiments of the present disclosure can be used in fields involving back-contact solar cell technology.

REFERENCE NUMERALS

10-silicon wafer, 11*a*-first tunneling silicon-oxide layer, 11*b*-first doped polycrystalline silicon layer, 12*a*-second tunneling silicon-oxide layer, 12*b*-second doped polycrystalline silicon layer, 13-mask layer, 14-antireflection layer, 15-amorphous silicon passivation layer, 16-doped silicon layer, 17-conductive film layer, 18*n*-first metal electrode, 18*p*-second metal electrode.

What is claimed is:
1. A double-sided tunneling silicon-oxide passivated back-contact solar cell, comprising a silicon wafer with a front surface and a back surface, wherein on the back surface of the silicon wafer, a first semiconductor layer and a second semiconductor layer are provided, and on the front surface of the silicon wafer, a passivation layer is provided, wherein the first semiconductor layer comprises a first tunneling silicon-oxide layer and a first doped polycrystalline silicon layer, sequentially arranged from inside to outside; the passivation layer comprises a second tunneling silicon-oxide layer and a second doped polycrystalline silicon layer, sequentially arranged from inside to outside; a thickness of the first doped polycrystalline silicon layer is 3-8 times that of the second doped polycrystalline silicon layer; the back surface of the silicon wafer is provided with a first phosphorus-doped diffusion region, and the front surface of the silicon wafer, which is a textured surface, is provided with a second phosphorus-doped diffusion region; and a ratio of a depth of the first phosphorus-doped diffusion region to a depth of the second phosphorus-doped diffusion region ranges from 1-6:1; and the first tunneling silicon-oxide layer, the first doped polycrystalline silicon layer, the second tunneling silicon-oxide layer, and the second doped polycrystalline silicon layer are formed by following method: forming, at the same time, the first tunneling silicon-oxide layer and the first doped polycrystalline silicon layer of the back surface of the silicon wafer, and the second tunneling silicon-oxide layer and the second doped polycrystalline silicon layer of the front surface of the silicon wafer, wherein the first doped polycrystalline silicon layer and the second doped polycrystalline silicon layer are formed after forming the first tunneling silicon-oxide layer and the second tunneling silicon-oxide layer, comprising:

at first, depositing undoped intrinsic amorphous silicon layers, at the same time on the first tunneling silicon-oxide layer of the back surface of the silicon wafer and the second tunneling silicon-oxide layer of the front surface of the silicon wafer;

then, plating a phosphorus-doped film layer by in-situ doping on the back surface;

proceeding with phosphorus diffusion, ensuring that both the front surface and the back surface of the silicon wafer remain exposed during the phosphorus diffusion; and finally, removing phosphosilicate glass layers.

2. The back-contact solar cell according to claim 1, wherein a ratio of surface doping indices of the first doped polycrystalline silicon layer to the second doped polycrystalline silicon layer is within a range of 0.2-5:1; and the surface doping index is defined as a ratio of an effective doping concentration of a respective doped polycrystalline silicon layer to a thickness of the doped polycrystalline silicon layer.

3. The back-contact solar cell according to claim 1, wherein an effective doping concentrations of the first doped polycrystalline silicon layer and the second doped polycrystalline silicon layer are each independently in a range of 1e19 to 4e20 cm$^{-3}$; a thickness of the first doped polycrystalline silicon layer is in a range of 50 to 200 nm; and a thickness of the second doped polycrystalline silicon layer is in a range of 15 to 50 nm; and/or a thickness of the first tunneling silicon-oxide layer and the second tunneling silicon-oxide layer is independently in a range of 1 to 3 nm.

4. The back-contact solar cell according to claim 1, wherein the second semiconductor layer comprises, arranged sequentially from inside to outside, an amorphous silicon passivation layer and a doped silicon layer; and the doped silicon layer is either a doped amorphous silicon layer or a doped microcrystalline silicon layer; and/or a thickness of the amorphous silicon passivation layer is within a range of 3 to 15 nm, while a thickness of the doped silicon layer is within a range of 4 to 30 nm.

5. The back-contact solar cell according to claim 4, wherein the silicon wafer is either N-type or P-type; and the first doped polycrystalline silicon layer and the second doped polycrystalline silicon layer are both N-type doped, and the doped silicon layer is P-type doped.

6. The back-contact solar cell according to claim 1, wherein the back surface of the silicon wafer is provided with a first region of the first semiconductor layer in direct contact with the silicon wafer, a second region of the second semiconductor layer in direct contact with the silicon wafer, and a transition region between the first region and second region;

and the transition region comprises, arranged sequentially from inside to outside, the first semiconductor layer, the second semiconductor layer, and a mask layer optionally provided between the first semiconductor layer and the second semiconductor layer.

7. The back-contact solar cell according to claim 6, wherein a width of the first region ranges from 0.1 to 0.3 mm, a width of the second region ranges from 0.3 to 0.6 mm, and a thickness of the mask layer ranges from 30 to 80 nm.

8. The back-contact solar cell according to claim 6, wherein the back-contact solar cell further comprises:

an antireflection layer arranged on the passivation layer;

a conductive film layer arranged on the back surface of the silicon wafer, and located on surfaces of the first region, the second region, and the transition region, wherein a portion of the conductive film layer located in the transition region is provided with an insulating trench; and a metal electrode arranged on the first region and the second region respectively, wherein the metal electrode is located on a surface of the conductive film layer, wherein a thickness of the antireflection layer on the textured surface ranges from 60 to 85 nm, a thickness of the conductive film layer ranges from 30 to 120 nm, and a width of the insulating trench ranges from 20 to 120 µm.

9. A preparation method of the back-contact solar cell according to claim 1, wherein the preparation method comprises following steps:

S101, providing a cleaned silicon wafer that has been polished on the back surface and textured on the front surface;

S102, simultaneously forming the corresponding tunneling silicon-oxide layer and the doped polycrystalline silicon layer on both the back surface and the front surface of the silicon wafer, and the process of forming the doped polycrystalline silicon layer after forming the tunneling silicon-oxide layer comprises:

at first, simultaneously depositing undoped intrinsic amorphous silicon layers on surfaces of corresponding tunneling silicon-oxide layers on the back surface and the front surface;

then, plating a phosphorus-doped film layer by in-situ doping on the back surface, wherein the phosphorus-doped film layer is either a polycrystalline silicon film layer or an amorphous silicon film layer;

proceeding with phosphorus diffusion, ensuring that both the front surface and the back surface of the silicon wafer remain exposed during the phosphorus diffusion to ensure simultaneous phosphorus diffusion and simultaneous formation of phosphosilicate glass layers on the front surface and the back surface; and finally, removing the phosphosilicate glass layers, wherein a sum of thicknesses of the intrinsic amorphous silicon layer and the phosphorus-doped film layer is controlled to be 3-8 times a thickness of the intrinsic amorphous silicon layer.

10. The preparation method according to claim 9, wherein the intrinsic amorphous silicon layer is deposited using LPCVD, and the phosphorus-doped film layer is plated using PECVD; a doping concentration of phosphorus in the phosphorus-doped film layer ranges from 1e19 to 4e20 cm$^{-3}$, and conditions of the phosphorus diffusion comprise: firstly, entering a first phase of pre-deposition, wherein in the first phase, at least one of phosphorus oxychloride, nitrogen, or oxygen is introduced, which leads to a chemical reaction that forms elemental phosphorus and a PSG layer; and a reaction temperature during the first phase is 750-850° C., and a duration is 5-180 min; subsequently, entering a second phase of temperature-rising phosphorus diffusion, wherein the second phase takes place in an oxygenated atmosphere; as the phosphorus diffusion progresses with an increased temperature, a non-doped oxide layer forms between the PSG layer and the intrinsic amorphous silicon layer; and a temperature for the second phase is 800-900° C., lasting 10-300 min; and/or the preparation method further comprises, in S102, laser doping a part region of a phosphosilicate glass layer formed on the back surface that is at a N-type emitter by laser SE, thus enhancing an effective doping concentration and a diffusion depth; then, the phosphosilicate glass layer is removed.

11. The preparation method according to claim 9, wherein the preparation method further comprises:

S103, forming a mask layer on the back surface of the silicon wafer obtained from S102 and forming an antireflection layer on the front surface of the silicon wafer;

S104, performing the first etching opening on the back surface of the silicon wafer obtained from S103, forming second semiconductor opening regions Wp spaced apart from each other; then, cleaning to expose the silicon wafer within Wp;

S105, depositing a second semiconductor layer on the back surface of the silicon wafer obtained from S104;

S106: performing a second etching opening on the back surface of the silicon wafer obtained from S105, forming first semiconductor opening regions Wn, alternately arranged with the second semiconductor opening regions Wp; forming transition regions Wg, between Wp and Wn; and then, cleaning to expose the doped polycrystalline silicon layer;

S107, depositing a conductive film layer on the back surface of the silicon wafer obtained from S106;

S108, performing a third etching opening on a part of the conductive film layer, located in the transition regions Wg, of the back surface of the silicon wafer obtained from S107, and forming an insulating trench Wi; and S109, forming metal electrodes on surfaces of the second semiconductor opening regions Wp, and the first semiconductor opening regions Wn, of the back surface of the silicon wafer obtained from S108.

12. The preparation method according to claim 11, wherein the first etching opening uses a laser opening method; the laser is either ultraviolet or green light, and a pulse width of the laser is less than 100 ns; and the second etching opening uses a laser opening method; the laser is either ultraviolet or green light, and a pulse width of the laser is less than 50 ns.

* * * * *